(12) United States Patent
Chang et al.

(10) Patent No.: US 6,180,454 B1
(45) Date of Patent: Jan. 30, 2001

(54) METHOD FOR FORMING FLASH MEMORY DEVICES

(75) Inventors: Kent Kuohua Chang, Cupertino; John Jianshi Wang, San Jose; Wei-Wen Ou, Berkeley, all of CA (US)

(73) Assignee: Advanced Micro Devices, Inc., Sunnyvale, CA (US)

(*) Notice: Under 35 U.S.C. 154(b), the term of this patent shall be extended for 0 days.

(21) Appl. No.: 09/430,765

(22) Filed: Oct. 29, 1999

(51) Int. Cl.[7] .................................................. H01L 21/336
(52) U.S. Cl. .......................... 438/257; 438/266; 438/593
(58) Field of Search ..................................... 438/257, 258, 438/261, 263, 264, 266, 592, 593, 594

(56) References Cited

U.S. PATENT DOCUMENTS

| | | | |
|---|---|---|---|
| 4,698,787 | 10/1987 | Mukherjee et al. | 365/185 |
| 5,148,394 | 9/1992 | Iwahashi | 365/185 |
| 5,210,047 * | 5/1993 | Woo et al. | 438/266 |
| 5,231,299 | 7/1993 | Ning et al. | 257/316 |
| 5,420,060 | 5/1995 | Gill et al. | 437/52 |
| 5,460,991 * | 10/1995 | Hong | 438/266 |
| 5,508,957 | 4/1996 | Momodomi et al. | 365/185.17 |
| 5,512,505 | 4/1996 | Yuan et al. | 438/264 |
| 5,518,950 | 5/1996 | Ibok et al. | 437/67 |
| 5,561,620 | 10/1996 | Chen et al. | 365/218 |
| 5,598,369 | 1/1997 | Chen et al. | 365/185.27 |
| 5,650,649 | 7/1997 | Tsukiji | 257/316 |
| 5,654,217 | 8/1997 | Yuan et al. | 438/588 |
| 5,661,055 | 8/1997 | Hsu et al. | 438/259 |
| 5,680,345 | 10/1997 | Hsu et al. | 365/185.01 |
| 5,789,293 * | 8/1998 | Cho et al. | 438/257 |
| 6,040,216 * | 3/2000 | Sung | 438/257 |
| 6,117,732 * | 9/2000 | Chu et al. | 438/264 |

OTHER PUBLICATIONS

Haddad et al., "Degradations Due to Hole Trapping in Flash Memory Cells", IEEE Electron Device Letters, vol. 10, No. 3 (Mar. 1989), pp. 117–119.
Wolf et al.; "Silicon Process For The VLSI Era vol.1: Process Technology", Lattice Press (1986) p. 28.
Wolf et al., "Silicon Processing For The VLSI Era vol. 1: Process Technology", Lattice Press (1986) pp. 177–182.

* cited by examiner

*Primary Examiner*—Chandra Chaudhari
*Assistant Examiner*—Jack Chen
(74) *Attorney, Agent, or Firm*—Amin, Eschweiler & Turocy, LLP

(57) ABSTRACT

In one embodiment, the present invention relates to a method of forming a flash memory device involving the steps of forming a gate oxide layer on a substrate; forming a first poly layer over the gate oxide layer; forming an insulating layer over the first poly layer, the insulating layer comprising a first oxide layer over the first poly layer, a nitride layer over the first oxide layer, and a second oxide layer over the nitride layer; forming a second poly layer over the insulating layer; forming a tungsten silicide layer over the second poly layer; etching a portion of the tungsten silicide layer and the second poly layer, wherein in the etched portion at least about 20% of the second poly is not etched, thereby partially defining at least one stacked gate structure; etching at least a portion of the insulating layer and the unetched portion of the second poly layer thereby defining at least one select gate transistor structure; forming an interlayer dielectric layer over the select gate transistor structure and substrate; etching a contact hole through the interlayer dielectric layer to the first poly layer; and filling the contact hole with a conductive material to thereby form a flash memory device.

20 Claims, 6 Drawing Sheets

FIG. 3H

METHOD FOR FORMING FLASH MEMORY DEVICES

TECHNICAL FIELD

The present invention generally relates to flash memory devices such as EEPROMs. More particularly, the present invention relates to flash memory devices having improved poly 1—select gate contact performance.

BACKGROUND ART

Semiconductor devices typically include multiple individual components formed on or within a substrate. Such devices often comprise a high density section and a low density section. For example, as illustrated in prior art FIG. 1a, a memory device such as a flash memory 10 comprises one or more high density core regions 11 and a low density peripheral portion 12 on a single substrate 13. The high density core regions 11 typically consist of at least one M×N array of individually addressable, substantially identical floating-gate type memory cells and the low density peripheral portion 12 typically includes input/output (I/O) circuitry and circuitry for selectively addressing the individual cells (such as decoders for connecting the source, gate and drain of selected cells to predetermined voltages or impedances to effect designated operations of the cell such as programming, reading or erasing).

Figure 1A:
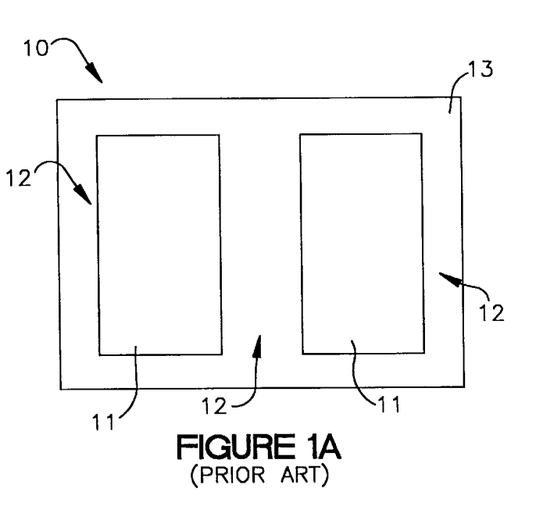
FIGS. 1a to 1c are various views of relevant portions of a conventional flash memory device.
Figure 1B:
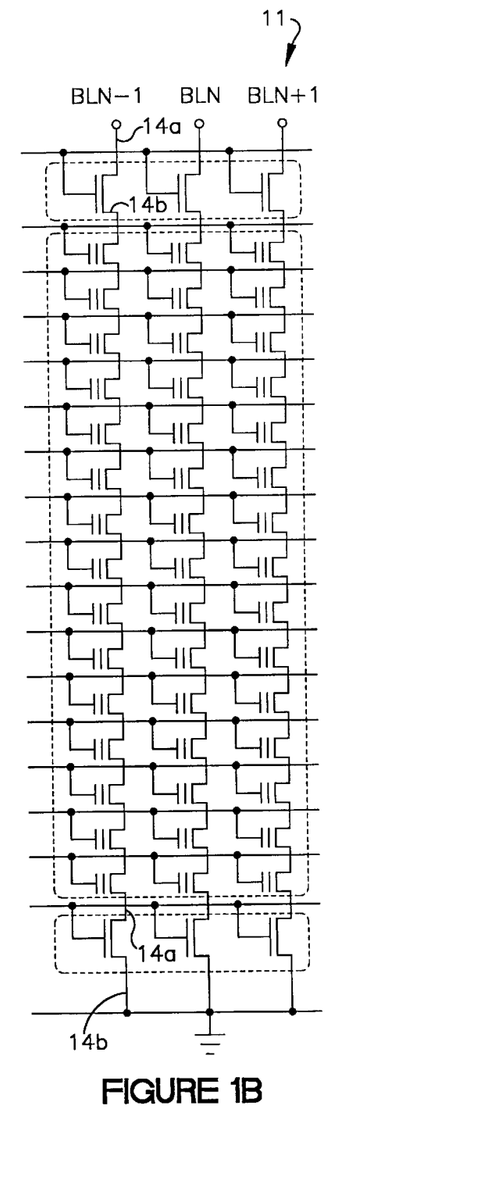

The memory cells within the core portion 11 are coupled together in a NAND-type circuit configuration, such as, for example, the configuration illustrated in prior art FIG. 1b. Each memory cell 14 has a drain 14a, a source 14b and a stacked gate 14c. A plurality of memory cells 14 connected together in series with a drain select transistor at one end and a source select transistor at the other end to form a NAND string as illustrated in prior art FIG. b. Each stacked gate 14c is coupled to a word line (WL0, WL1 , . . . , WLn) while each drain of the drain select transistors are coupled to a bit line (BL0, BL1, . . . , BLn). Lastly, each source of the source select transistors are coupled to a common source line Vss. Using peripheral decoder and control circuitry, each memory cell 14 can be addressed for programming, reading or erasing functions.

Figure 1C:
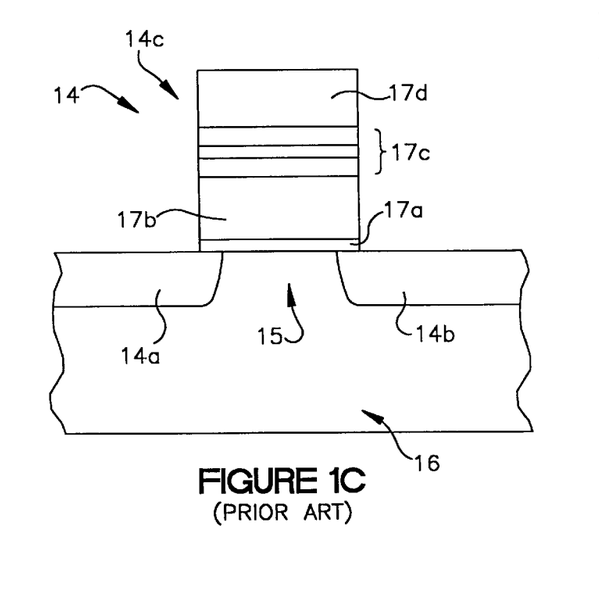

Prior art FIG. 1c represents a fragmentary cross section diagram of a typical memory cell 14 in the core region 11 of prior art FIGS. 1a and 1b. Such a cell 14 typically includes the source 14b, the drain 14a and a channel 15 in a substrate or P-well 16; and the stacked gate structure 14c overlying the channel 15. The stacked gate 14c further includes a thin gate dielectric layer 17a (commonly referred to as the tunnel oxide) formed on the surface of the P-well 16. The stacked gate 14c also includes a polysilicon floating gate 17b which overlies the tunnel oxide 17a and an interpoly dielectric layer 17c overlies the floating gate 17b. The interpoly dielectric layer 17c is often a multilayer insulator such as an oxide-nitride-oxide (ONO) layer having two oxide layers sandwiching a nitride layer. Lastly, a polysilicon control gate 17d overlies the interpoly dielectric layer 17c. The control gates 17d of the respective cells 14 that are formed in a lateral row share a common word line (WL) associated with the row of cells (see, for example, prior art FIG. 1b). In addition, as highlighted above, the drain regions 14a of the respective cells in a vertical column are connected together by a conductive bit line (BL). The channel 15 of the cell 14 conducts current between the source 14b and the drain 14a in accordance with an electric field developed in the channel 15 by the stacked gate structure 14c.

The select transistors have a stacked gated structure similar to the memory cells, except that the first polysilicon layer (floating gate) and the second polysilicon layers (control gate) are shorted together to form a single gate type structure. Select gates typically ensure the selectivity of a particular bit line and prevent the memory cells from passing current during the program operation.

A poly 1 contact is made to the first polysilicon gate of the select transistor while a poly 2 contact is made to the tungsten silicide/second polysilicon gate (control gate) of the memory cells. These contacts are typically formed through an oxide layer covering the memory cells and select transistors (a so-called interlayer dielectric). These contacts are also typically formed at about the same time (or during the same processing window). However, while the depth of the poly 2 contact is smaller than the depth of the poly 1 contact, the time required to form an high quality poly 2 contact is undesirably greater than the amount of time required to form a poly 1 contact.

This phenomenon leads to deleterious overetching of the poly 1 layer (first polysilicon layer). In some instances, the overetching is severe enough that the poly 1 contact opening extends into the field oxide and/or even into the substrate. Such overetching is termed punch-through. Poly 1 contact punch-through renders the select gate inoperable, consequently resulting in failure of the flash memory device. In instances where the overetching is not so severe (where the poly 1 contact opening extends deep into the first polysilicon layer, but not completely through), there is a resultant increase in poly 1 contact resistivity. Increases in poly 1 contact resistivity can lead to parametric failure of the flash memory device, and/or latent reliability problems since the increased contact resistivity often leads to thermal heating, which, in turn, further increases the resistivity often leading to device failure.

Attempts to address punch-through involve making the first polysilicon layer thicker. But the thicker the first polysilicon layer, the more likely undesirable cracking occurs in the tungsten silicide layer and the more likely etch problems occur due to high aspect ratios and high topographies. Moreover, there are numerous other concerns associated with setting the thickness of the first polysilicon layer. For example, the thicker the floating gate, the higher the stress released on the tunnel oxide layer, improving tunnel oxide reliability, improving conductivity and thus resulting in better circuit performance. The thinner the floating gate, the more likely an increase in pinhole defects. Further, when the thickness of the Poly 1 is too thin, an HF dip cleaning step (prior to forming the ONO multilayer dielectric film) may degrade the Poly 1 and attack the tunnel oxide. Therefore, it is desirable to set the thickness of the first polysilicon layer without regard to punch-through problems, since there are other important concerns to address. It is also desirable, nevertheless to address the undesirable punch-through problem.

SUMMARY OF THE INVENTION

As a result of the present invention, a flash memory device having improved reliability is obtainable by providing an improved poly 1—select gate contact. By forming a poly 1 contact in accordance with the present invention, punch-through of the poly 1 layer and field oxide layer by the poly 1 contact is minimized and/or eliminated. Moreover, by forming a poly 1 contact in accordance with the present invention, the resistivity of the poly 1—select gate contact is reduced, thereby improving the performance and reliability of flash memory devices. Addressing punch-through and resistivity problems without regard to the thickness of the floating gate, enables the selection of a floating gate thickness based on fewer concerns, thereby better addressing the concerns associated with floating gate thickness. According, also as a result of the present invention, producing a flash memory device where the occurrence of microcracking in the tungsten silicide conductive layer is minimized and/or eliminated, where pinhole defects are minimized and/or eliminated, and/or where HF dip cleaning degradation is minimized and/or eliminated is possible.

In one embodiment, the present invention relates to a method of forming a flash memory device involving the steps of forming a gate oxide layer on a substrate; forming a first poly layer over the gate oxide layer; forming an insulating layer over the first poly layer, the insulating layer comprising a first oxide layer over the first poly layer, a nitride layer over the first oxide layer, and a second oxide layer over the nitride layer; forming a second poly layer over the insulating layer; forming a tungsten silicide layer over the second poly layer; etching a portion of the tungsten silicide layer and the second poly layer, wherein in the etched portion at least about 20% of the second poly is not etched, thereby partially defining at least one stacked gate structure; etching at least a portion of the insulating layer and the unetched portion of the second poly layer thereby defining at least one select gate transistor structure; forming an interlayer dielectric layer over the select gate transistor structure and substrate; etching a contact hole through the interlayer dielectric layer to the first poly layer; and filling the contact hole with a conductive material to thereby form a flash memory device.

In another embodiment, the present invention relates to a method of forming a select gate transistor poly 1 contact in a flash memory device comprising a substrate, a gate oxide layer over the substrate, a poly 1 layer over the gate oxide layer, an interpoly dielectric layer over the poly 1 layer, a poly 2 layer over the interpoly dielectric layer, and a tungsten silicide layer over the poly 2 layer, involving the steps of etching anisotropically a portion of the tungsten silicide layer and the poly 2 layer, wherein in the etched portion from about 30% to about 80% of the poly 2 layer is removed, thereby partially defining a select gate transistor; etching anisotropically at least a portion of the interpoly dielectric layer and the unetched poly 2 layer from the etched portion thereby defining the select gate transistor; forming an interlayer dielectric layer over the select gate transistor; etching anisotropically a contact hole through the interlayer dielectric layer to the poly 1 layer; and filling the contact hole with a conductive material thereby forming the select gate transistor poly 1 contact.

In yet another embodiment, the present invention relates to a method of preventing punch-through of a first doped amorphous silicon layer by a poly 1 contact in a NAND flash memory device comprising a substrate, a gate oxide layer over the substrate, the first doped amorphous silicon layer having a thickness from about 400 Å to about 1,200 Å over the gate oxide layer, an interpoly dielectric layer over the first doped amorphous silicon layer, a second doped amorphous silicon layer over the interpoly dielectric layer, and a tungsten silicide layer made using dichlorosilane over the second doped amorphous silicon layer, involving the steps of etching anisotropically a portion of the tungsten silicide layer and the second doped amorphous silicon layer, wherein in the etched portion from about 35% to about 75% of the second doped amorphous silicon layer is removed, thereby partially defining a select gate transistor; etching anisotropically at least a portion of the interpoly dielectric layer and the unetched second doped amorphous silicon layer from the etched portion thereby defining the select gate transistor; forming an interlayer dielectric layer over the select gate transistor; etching anisotropically a contact hole through the interlayer dielectric layer to the first doped amorphous silicon layer; and filling the contact hole with a conductive material comprising tungsten thereby forming the select gate transistor poly 1 contact.

DISCLOSURE OF INVENTION

By forming a poly 1—select gate contact in a manner where punch-through of the poly 1 layer is minimized and/or eliminated, the performance and reliability of flash memory devices can be increased. While not wishing to be bound to any theory, it is believed that by forming the poly 1—select gate contact according to the present invention, it is consequently possible to prevent punch-through of the poly 1 layer by the poly 1 contact, as well as reduce the resistivity of the poly 1—select gate contact.

When fabricating flash memory devices, formation of memory cells, select transistor gates, and contacts to the memory cells and select transistor gates involves several important etch steps (which are described hereinbelow); namely, a second gate etch, a self aligned etch, and a contact etch. According to the present invention, by reducing the second gate etch, and optionally increasing the self aligned etch, punch-through of the poly 1 layer is minimized and/or eliminated during the contact etch. Consequently, improved poly 1 contact performance and reliability in flash memory devices is achieved by the methods of the present invention.

Figure 2A:
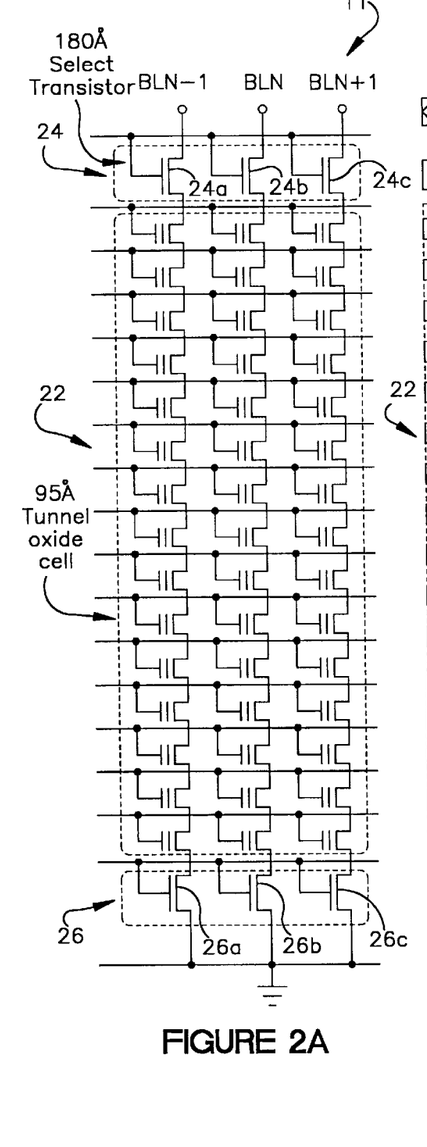
FIGS. 2a and 2b are schematic views of relevant portions of a flash memory device in accordance with the present invention.
Figure 2B:
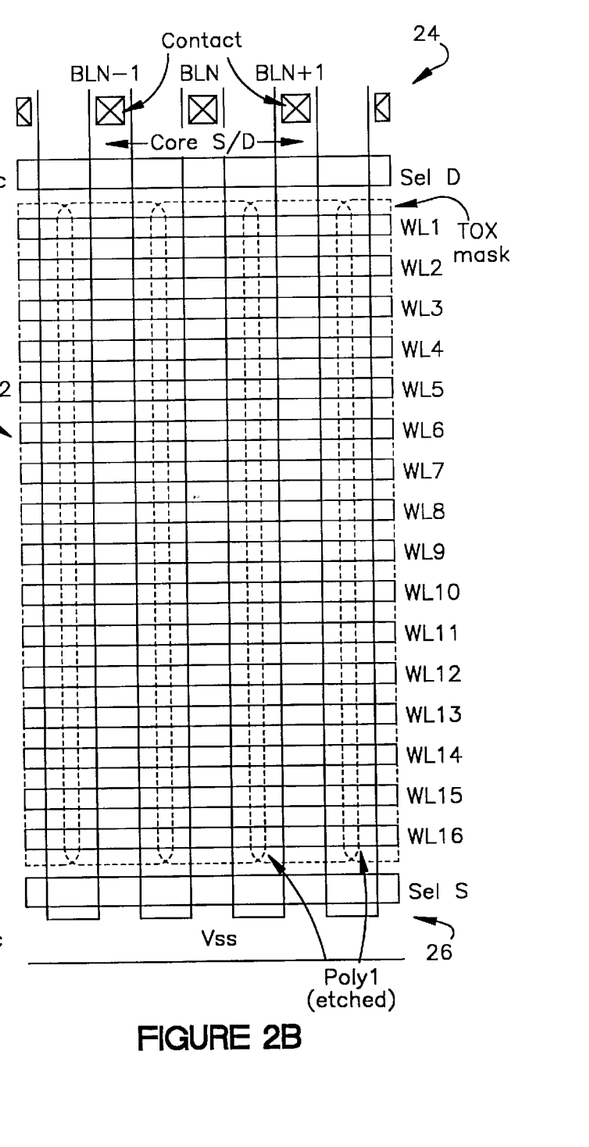

The present invention may be understood and its advantages appreciated in conjunction with FIGS. 2a and 2b. A circuit schematic diagram illustrating a core portion 11 of a NAND-type flash memory device is illustrated in FIG. 2a. The core portion 11 includes a memory cell region 22 which is bounded on one side by a drain select transistor portion 24 and bounded on another side by a source select transistor portion 26. Each of the select transistor portions 24 and 26 contain select gate transistors 24a–24c and 26a–26c, respectively, which operate to selectively activate a desired bit line (for example, BLN–1, BLN, BLN+1) by ensuring the selectivity of each bit line and preventing the cell current from conducting current through the bit line during a programming operation as is known by those skilled in the art.

In the NAND-type flash memory process which forms the core circuit 12 of FIG. 2a and its corresponding circuit layout (of which FIG. 2b is a plan view), an improved process is used to form the select gate transistor and the select gate poly 1 contact.

The core select gate transistors 24a–24c and 26a–26c are somewhat similar in structure to the stacked gate flash memory structures in the memory cell region 22 except that their gate oxide is approximately twice as thick as the memory cell oxide (also called the tunnel oxide) in the stacked gate structure of the memory cell (typically about 170 Å compared to about 90 Å). The select transistors 24a–24c utilize a gate oxide of about 170 Å to improve the reliability of the transistors by reducing the vulnerability of the devices to band to band tunneling induced hot carrier stress during programming. A plan circuit layout view of the conventional NAND-type circuit arrangement 12 is illustrated in FIG. 2b.

Prior to providing a specific example of the methods of the present invention, a general example is provided. An oxide is grown using any suitable means, such as dry oxidation, wet oxidation or thermal oxidation, on at least a portion of a semiconductor substrate, which is typically made of silicon. This process highlights the activity in the core region of the substrate, which is where the stacked memory cells and the select gate transistors are subsequently positioned. In this connection, the core region of the substrate contains two areas; namely, the stacked memory cell area and the select gate transistor area. It is noted that the periphery region of the substrate contains low voltage transistor areas and high voltage transistor areas. The oxide later serves as a portion of the select gate transistor oxide. The oxide layer in most embodiments covers the core region and the periphery region of the substrate.

Next, a first doped amorphous silicon layer is provided over at least a portion of the oxide layer (typically over the core region and the periphery region). The first doped amorphous silicon layer later serves as the floating gate of the stacked memory cell (also termed poly 1) and the gate of the select gate transistor. In one embodiment, the first doped amorphous silicon layer is made using an in situ doping process employing relatively low temperatures and specific doping conditions. In another embodiment, polysilicon is used instead of amorphous silicon. In this connection, the term poly 1 (or poly 2) includes both amorphous silicon layers and polysilicon layers. In one embodiment, the poly 1 layer has a thickness from about 400 Å to about 1,200 Å, and preferably from about 500 Å to about 1,100 Å. In another embodiment, the poly 1 layer has a thickness from about 600 Å to about 1,000 Å. Since punch-through problems are addressed by etching steps described later, a wide range of poly 1 thicknesses may be employed. This is an advantage because the poly 1 thickness can be tailored to address other concerns (without regard to possible punch-through).

A dielectric layer is provided using any suitable means over at least a portion of the poly 1 layer (typically over the core region and the periphery region). The dielectric layer preferably contains three layers; namely two oxide layers sandwiching a nitride layer (a so-called ONO layer). The dielectric layer later serves as the interpoly dielectric layer of the stacked memory cell. In one embodiment, the dielectric layer has a thickness from about 100 Å to about 160 Å.

A mask is provided over the core region, leaving the dielectric layer exposed in the periphery region. The dielectric layer, the first doped amorphous silicon layer, and the oxide layer in the periphery region are etched using suitable procedures, which may optionally include corresponding cleaning steps. This etch procedure is termed a "first gate etch", as the first doped amorphous silicon layer is positioned, as a result of the etch, to form gates for the subsequently formed memory cells and the select gate transistors. Procedures in the periphery region are not further discussed in detail.

A second doped amorphous silicon layer is provided using any suitable means over at least a portion of the substrate. The second doped amorphous silicon layer later serves as the control gate of the stacked memory cell (also termed Poly 2). In one embodiment, the poly 2 layer has a thickness from about 1,000 Å to about 1,400 Å. In another embodiment, polysilicon is used instead of amorphous silicon.

A tungsten silicide layer is next provided over at least a portion of the poly 2 layer. The tungsten silicide layer may be formed by suitable means, such as via CVD techniques using a gas flow including either $SiH_2Cl_2$ and $WF_6$ or $SiH_4$ and $WF_6$. The gas flow may further contain an inert gas, such as a noble gas (He, Ne, Ar, Kr and Xe). In a preferred embodiment, the tungsten silicide layer is provided using $SiH_2Cl_2$ and $WF_6$ with an inert gas. After the tungsten silicide deposition, an optional rapid thermal anneal (RTA) is performed in a nitrogen atmosphere. In one embodiment, the tungsten silicide layer has a thickness from about 1,000 Å to about 1,800 Å. Additional layers are provided using any suitable means over portions of the tungsten silicide. For example, a silicon oxynitride layer may be provided over the tungsten silicide layer.

A mask is provided over the stacked memory cell areas and the select gate transistor areas of the core region, leaving the silicon oxynitride layer partially exposed in the other areas. The silicon oxynitride layer, the tungsten silicide layer, and the poly 2 layer in the exposed areas are etched in accordance with the present invention. This etch procedure is termed a "second gate etch", as the poly 2 layer is positioned, as a result of the etch, to form gates for the subsequently formed memory cells and the select gate transistors. The dielectric layer (typically the ONO layer) acts as an etch stop layer during the second gate etch.

Conventionally, the entire silicon oxynitride layer, the tungsten silicide layer, and the poly 2 layer in the exposed areas are etched, or at least the entire silicon oxynitride layer and the tungsten silicide layer, and at least about 95% (by thickness) of the poly 2 layer in the exposed areas are etched to partially form the memory cells and the select gate transistors. However, in accordance with the present invention, the entire silicon oxynitride layer and the tungsten silicide layer, and from about 30% to about 80% (by thickness) of the poly 2 layer are etched to partially form the memory cells and the select gate transistors. In another embodiment, the entire silicon oxynitride layer and the tungsten silicide layer, and from about 35% to about 75% (by thickness) of the poly 2 layer are etched to partially form the memory cells and the select gate transistors. In yet another embodiment, the entire silicon oxynitride layer and the tungsten silicide layer, and from about 40% to about 70% (by thickness) of the poly 2 layer are etched to partially form the memory cells and the select gate transistors.

The second gate etch in accordance with the present invention involves etching each individual layer until the dielectric layer is exposed. If present, the silicon oxynitride layer is etched in any suitable manner, such as using at least one fluorocarbon compound, and optionally oxygen and/or an inert gas. The silicon oxynitride layer is etched so that substantially all, and preferably all of the exposed portions are removed down to the tungsten silicide layer. Etching is preferably an anisotropic etch process.

Fluorocarbon compounds include $CF_4$, $CHF_3$ and $CFH_3$. Inert gases include one or more noble gas and/or nitrogen. Nobles gases include He, Ne, Ar, Kr, and Xe. In one embodiment, the gas flow contains from about 10 to about 100 sccm of at least one fluorocarbon compound, from about 0 to about 50 sccm of oxygen and from about 0 to about 500 sccm of an inert gas. In another embodiment, the gas flow contains from about 25 to about 75 sccm of at least one fluorocarbon compound, from about 1 to about 25 sccm of oxygen and from about 10 to about 250 sccm of an inert gas. In yet another embodiment, the gas flow contains from about 30 to about 60 sccm of at least one fluorocarbon compound, from about 2 to about 10 sccm of oxygen and from about 25 to about 200 sccm of an inert gas. In one embodiment, at least two fluorocarbons are employed. In one embodiment, the silicon oxynitride is etched at a power from about 250 W to about 750 W under from about 10 to about 200 mTorr. In another embodiment, the silicon oxynitride is etched at a power from about 350 W to about 650 W under from about 20 to about 100 mTorr.

The tungsten silicide layer is etched in any suitable manner, such as using a halogen compound, and optionally oxygen and/or an inert gas. The tungsten silicide layer is etched so that substantially all, and preferably all of the exposed portions are removed down to the poly 2 layer. Etching is preferably an anisotropic etch process.

Halogen compounds contain one or more halogen atoms and include one or more of $Cl_2$, chlorocarbons, $SF_6$, fluorocarbons and HBr. Oxygen may be supplied in a mixture with an inert gas, such as a 50/50 mixture with helium. In one embodiment, the gas flow contains from about 50 to about 300 sccm of at least one halogen compound and from about 0 to about 50 sccm of oxygen and/or an inert gas. In another embodiment, the gas flow contains from about 100 to about 250 sccm of at least one halogen compound and from about 1 to about 40 sccm of oxygen and/or an inert gas. In yet another embodiment, the gas flow contains from about 150 to about 200 sccm of at least one halogen compound and from about 5 to about 30 sccm of oxygen and/or an inert gas. In one embodiment, the tungsten silicide is etched at a power from about 1,200 W to about 2,000 W under from about 0.1 to about 20 mTorr. In another embodiment, the tungsten silicide is etched at a power from about 1,400 W to about 1,800 W under from about 1 to about 10 mTorr.

The poly 2 layer is etched in any suitable manner, such as using a bromine compound, and optionally oxygen and/or an inert gas in embodiments where the poly 2 layer contains doped amorphous silicon. The poly 2 layer is etched so that from about 30% to about 80% of the exposed portions are removed. That is, at least about 20% of the poly 2 layer remains over the dielectric layer after etching. Etching is preferably an anisotropic etch process.

Bromine compounds include HBr. Oxygen may be supplied in a mixture with an inert gas, such as a 50/50 mixture with helium. In one embodiment, the gas flow contains from about 50 to about 200 sccm of a bromine compound and from about 0 to about 100 sccm of oxygen and/or an inert gas. In another embodiment, the gas flow contains from about 75 to about 175 sccm of a bromine compound and from about 10 to about 90 sccm of oxygen and/or an inert gas. In yet another embodiment, the gas flow contains from about 100 to about 150 sccm of a bromine compound and from about 25 to about 75 sccm of oxygen and/or an inert gas. In one embodiment, the poly 2 is etched at a power from about 50 W to out 400 W under from about 0.1 to about 25 mTorr. In another embodiment, the poly 2 is etched at a power from about 100 W to about 300 W under from about 1 to about 20 mTorr. Alternative conditions may be employed in embodiments where the poly 2 layer contains polysilicon.

After the second gate etch is completed, a mask is provided over the stacked memory cell areas and the select gate transistor areas of the core region (and also typically over the periphery region), leaving the dielectric layer partially exposed in the other areas. The silicon dielectric layer and portions of the first doped amorphous silicon layer in the exposed areas are etched in accordance with the present invention. This etch procedure is termed a "self aligned etch", and it completes formation of memory cells and the select gate transistors. In this etch step, the gate oxide layer acts as an etch stop layer (or the poly 1 layer acts as an etch stop layer when only portions of the dielectric layer are removed).

The self aligned etch in accordance with the present invention involves etching the dielectric layer and then the poly 1 layer until the gate oxide layer is exposed. The poly 1 layer is not etched in areas where a poly 1 contact is desired. The dielectric layer is etched in any suitable manner, such as using at least one fluorocarbon compound, and optionally oxygen and/or an inert gas. The dielectric layer is etched so that substantially all, and preferably all of the exposed portions are removed down to the poly 1 layer. Etching is preferably an anisotropic etch process.

In one embodiment, the gas flow contains from about 10 to about 100 sccm of at least one fluorocarbon compound, from about 0 to about 50 sccm of oxygen and from about 0 to about 500 sccm of an inert gas. In another embodiment, the gas flow contains from about 25 to about 75 sccm of at least one fluorocarbon compound, from about 1 to about 25 sccm of oxygen and from about 10 to about 250 sccm of an inert gas. In yet another embodiment, the gas flow contains from about 30 to about 60 sccm of at least one fluorocarbon compound, from about 5 to about 20 sccm of oxygen and from about 25 to about 200 sccm of an inert gas. In one embodiment, the dielectric is etched at a power from about 25 W to about 300 W under from about 1 to about 200 mTorr. In another embodiment, the silicon oxynitride is etched at a power from about 50 W to about 200 W under from about 5 to about 50 mTorr.

The poly 1 layer is etched (but not in the poly 1 contact areas) in any suitable manner, such as using a bromine compound, and optionally chlorine, oxygen and/or an inert gas. The poly 1 layer is etched so that substantially all, and preferably all of the exposed portions are removed down to the gate oxide layer. Etching is preferably an anisotropic etch process. This etching process is conducted thoroughly to prevent the formation of polystringers. In this connection, minor instances or amounts of overetching can be tolerated.

In one embodiment, the gas flow contains from about 50 to about 200 sccm of a bromine compound, from about 0 to about 50 sccm of chlorine, and from about 0 to about 75 sccm of oxygen and/or an inert gas. In another embodiment, the gas flow contains from about 75 to about 175 sccm of a bromine compound, from about 1 to about 40 sccm of chlorine, and from about 1 to about 50 sccm of oxygen and/or an inert gas. In yet another embodiment, the gas flow contains from about 100 to about 150 sccm of a bromine compound, from about 5 to about 30 sccm of chlorine, and from about 5 to about 30 sccm of oxygen and/or an inert gas. In one embodiment, the poly 1 is etched at a power from about 50 W to about 400 W under from about 10 to about 300 mTorr. In another embodiment, the poly 1 is etched at a power from about 100 W to about 300 W under from about 50 to about 200 mtorr. Alternative conditions may be employed in embodiments where the poly 1 layer contains polysilicon. Source and drain regions can be formed after the self align etch.

A dielectric layer, typically termed an interlevel oxide layer, is formed over the substrate, essentially encapsulating the memory cells and the select gate transistors. The dielectric layer preferably contains an oxide, including silicon dioxide, or an oxide glass including tetraethylorthosilicate (TEOS), phosphosilicate glass (PSG), borophosphosilicate glass (BPSG) and borophosphotetraethylorthosilicate (BPTEOS). Contact holes are then formed through the interlevel dielectric layer, to either the poly 1 layer or the poly 2 layer (via the tungsten silicide layer) using a contact etch process.

The contact etch process may be conducted in any suitable manner, but primarily the process depends upon the identity of the interlayer dielectric material. The contact etch is an anisotropic etching process. Typically, for example, the contact etch involves using at least one fluorocarbon compound and optionally an inert gas. Due to the reduced second gate etch, the contact etch takes approximately the same time regardless of whether a poly 1 contact hole or a poly 2 contact hole is formed. As a result, gauging or punch-through of the poly 1 layer is minimized and/or prevented. When a proper contact hole is formed, a high quality metal to silicon contact results (poly 1—select gate contact), characterized by reduced or low resistivity.

The contact holes are filled with conductive materials, and may include one or more barrier layers. Conductive materials include aluminum, copper, gold, palladium, platinum, titanium, tungsten, and alloys, nitrides and silicides thereof. The conductive materials are deposited in any suitable manner, including chemical vapor deposition (CVD) and physical vapor deposition (PVD) and then optionally planarized by, for example, chemical mechanical polishing (CMP).

As a result of the present invention, and in particular the conditions for forming the poly 1—select gate contact, a high quality flash memory device is produced. The conditions and processes for forming the poly 1—select gate contact lead to high quality contacts because of reduced resistivity and less punch-through of the poly 1 layer in the select gate transistors.

Referring to FIGS. 3A to 3H, a specific example of the fabrication of a poly 1—select gate contact is described. A plurality of flash memory cells and select gates can be formed on a semiconductor substrate, such as a silicon die, each with an N-type source region and N-type drain region formed within a P portion of the substrate and a P-type channel region interposed between the source and drain regions in accordance with the present invention. Although fabrication of one poly 1—select gate contact is described below, it will be understood by those skilled in the art that the methods described herein are applicable to mass production methods wherein two or more contacts are formed.

Figure 3A:
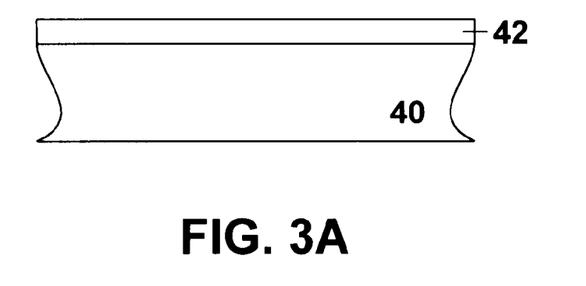
FIGS. 3A to 3H are cross-sectional views illustrating a flash memory cell fabrication method according to one embodiment of the present invention.

Specifically referring to FIG. 3A, a P-type substrate 40 is provided. Thereafter, a gate oxide layer 42 is formed over the substrate 40 having a thickness of, for example, about 50 Å to about 250 Å using a thermal growth process in a dry oxidation furnace. Two or more oxidation steps may also be employed. For instance, the gate oxide layer 42 can be formed via a two step oxidation process including a first dry oxidation at a temperature of about 900° C., under an atmosphere of oxygen at about 13.5 l, HCl at about 462 cc and argon at about 14 l to provide an oxide layer having a thickness from about 145 Å to about 150 Å, and second a dry oxidation at a temperature of about 1050° C., under an atmosphere of oxygen at about 1.33 l, HCl at about 70 cc and argon at about 12.6 l to provide an oxide layer having a thickness from about 165 Å to about 170 Å.

Figure 3B:
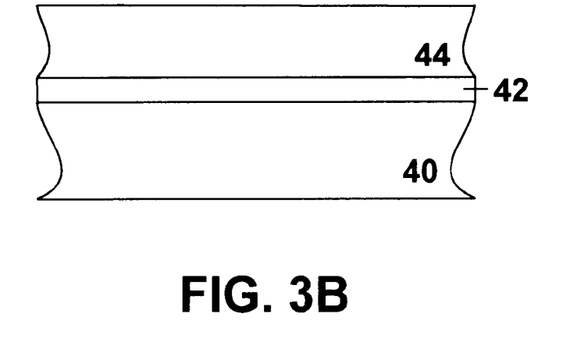

Referring to FIG. 3B, a poly 1 layer 44 is formed in any suitable manner over the gate oxide layer 42. For example, a phosphorus in situ doped amorphous silicon layer is deposited via LPCVD at 530° C., 400 mTorr, $SiH_4$ at 2000 sccm, and a mixture of 1% by weight $PH_3$ in helium at about 20 sccm. Doping lowers the resistivity of the poly 1 layer rendering it conductive. Alternatively, a doped polysilicon layer may be formed as the poly 1 layer. The poly 1 layer 44 has a thickness of about 900 Å.

Figure 3C:
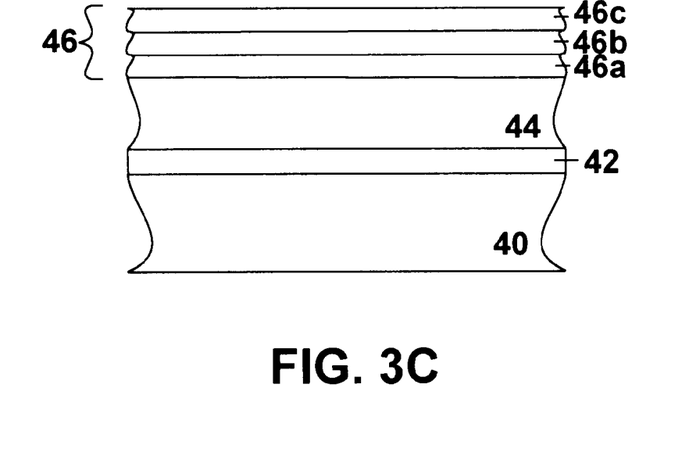

A multi-layer interpoly dielectric 46 is then formed in any suitable manner over the surface of the substrate 40, as illustrated in FIG. 3C. This layer 46 is often called the interpoly dielectric since (as will be seen shortly) it is sandwiched between the poly 1 layer and the poly 2 layer. The interpoly dielectric 46 is preferably a three layer region of oxide/nitride/oxide (the so called "ONO" layer) and typically has a total thickness of about 100 Å to about 400 Å.

Specifically referring to FIG. 3C, a first or bottom oxide layer 46a is formed using CVD techniques. For example, a bottom oxide layer 46a is formed at a temperature of about 750° C. under $SiH_4$ at 20 sccm, $N_2O$ at 1.2 l, and a carrier gas and a pressure of 600 mTorr via LPCVD oxide on the poly 1 layer. A nitride layer 46b is next formed also using CVD techniques. For example, nitride is formed at a temperature of about 760° C. under $NH_3$ at 600 sccm, $SiH_2Cl_2$ at 100 sccm and a pressure of 330 mTorr to form a nitride layer 46b. The second or top oxide layer 46c is formed in a similar manner as the first oxide layer or by wet oxidation at about 950° C. for about 40 minutes using oxygen (about 5 l) and hydrogen (about 9 l) to provide an oxide layer.

Figure 3D:
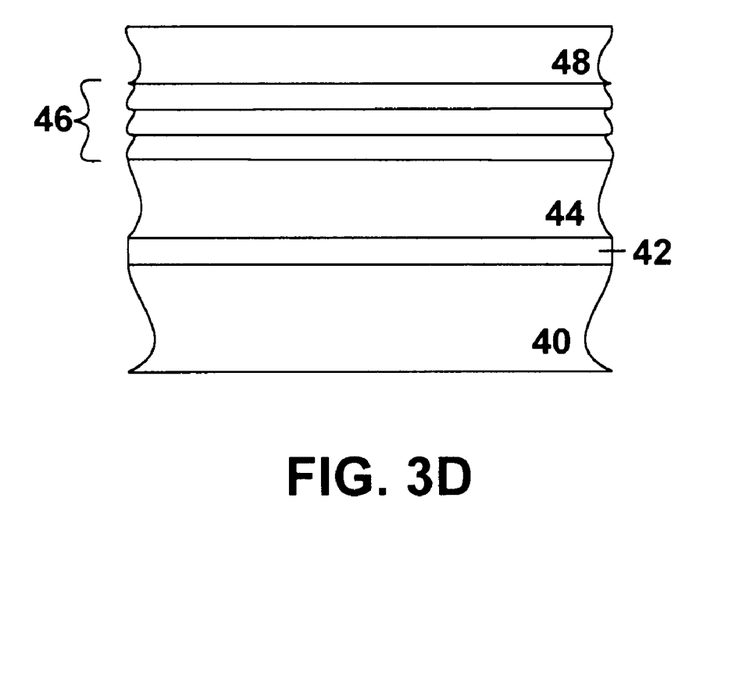

Referring to FIG. 3D, a poly 2 layer is formed in any suitable manner. Specifically, a phosphorus in situ doped amorphous polysilicon layer is formed via CVD to form a poly 2 layer 48 at about 530° C., 400 mTorr, $SiH_4$ at 2,000 sccm, and a mixture of 1% by weight $PH_3$ in helium at about 75 sccm. Alternatively, the poly 2 layer can be formed by LPCVD followed by ion implantation of a dopant such as phosphorus. In this connection, the poly 2 layer may alternatively contain polysilicon. Doping lowers the resistivity of the polysilicon rendering it conductive.

Figure 3E:
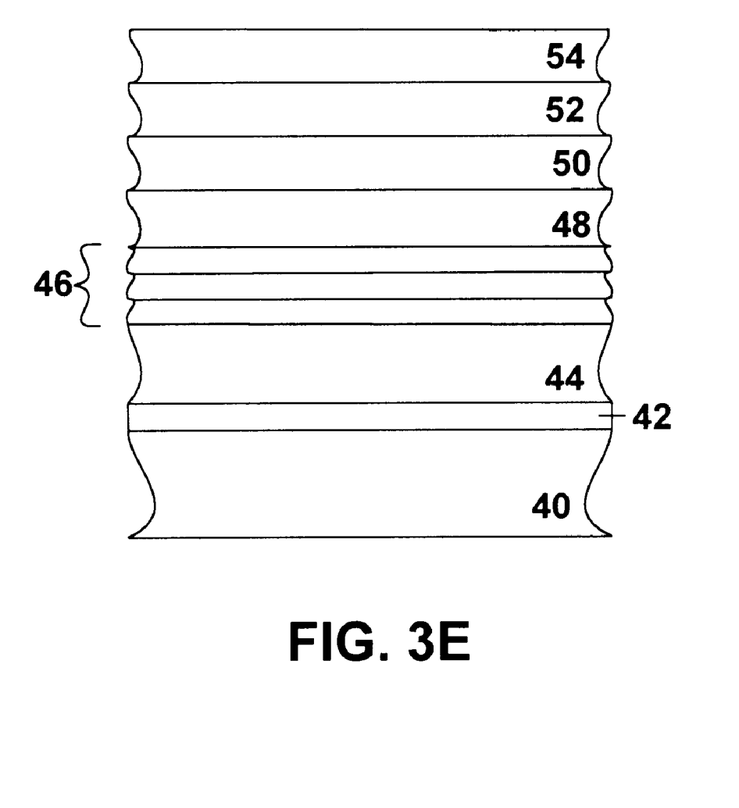

Referring to FIG. 3E, a tungsten silicide layer 50 is formed via CVD. The tungsten silicide layer 50 provides a lower resistance contact for improved flash memory cell and select gate performance. Specifically, the tungsten silicide is deposited at a temperature of about 565° C. and a pressure of about 93 Pa. The gas flow includes $SiH_2Cl_2$ and $WF_6$. The gas flow contains about 150 sccm $SiH_2Cl_2$ and about 5 sccm $WF_6$. The gas flow may further contain about 150 sccm to about 200 sccm of an inert gas, such as Ar. The thickness of the tungsten silicide layer is about 1,400 Å. After the tungsten silicide deposition, an optional RTA is performed in a nitrogen atmosphere. RTA is conducted at about 900° C. for about 20 seconds.

Optional poly-cap layer 52 is formed over the tungsten silicide layer 50. The poly-cap layer 52 is about 500 Å thick, and is formed via, for example, LPCVD. The poly-cap layer 52 can be used to prevent any potential peeling or cracking of the underlying tungsten silicide layer 50. Optional capping layer 54, for example, of SiON is deposited over the poly-cap layer 52. The capping silicon oxynitride layer 54 provides an anti-reflective coating at masking and also acts as a masking layer for subsequent etching.

Figure 3F:
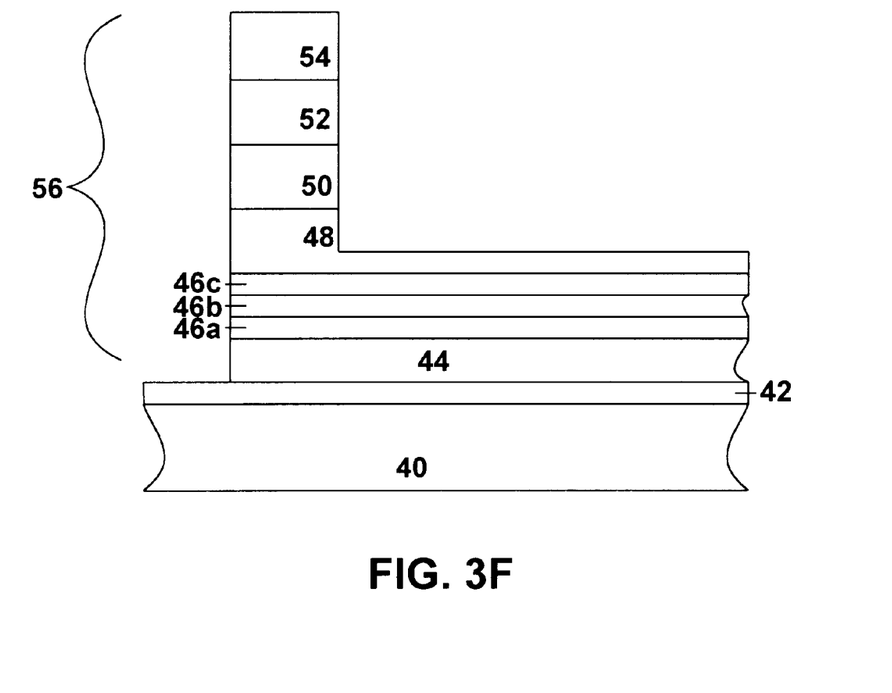

Referring to FIG. 3F, a gate etch is performed whereby selected portions of the SiON capping layer 54, poly-cap layer 52, tungsten silicide layer 50, and poly 2 layer 48 are removed to partially form the select gate transistor. Although not shown, a mask is formed over portions of the structure where the select gate transistors and memory cells are positioned, exposing the selected portions of the SiON capping layer 54, poly-cap layer 52, tungsten silicide layer 50, and poly 2 layer 48.

The silicon oxynitride layer 54 is etched in any suitable manner, such as using a gas flow containing 15 sccm of $CHF_3$, 30 sccm of $CF_4$, 5 sccm of oxygen and 100 sccm of argon at a power of 500 W under 50 mTorr. This etching is an anisotropic etch process. The poly-cap layer 52 and tungsten silicide layer 50 are etched in any suitable manner, such as using a gas flow containing 175 sccm of $Cl_2$, 12 sccm of nitrogen, and 8 sccm of a mixture of oxygen and helium at a power of 1,600 W under 3 mTorr. This etching is an anisotropic etch process. The poly 2 layer 48 is etched in any suitable manner, such as using a gas flow of 135 sccm of HBr, 45 sccm of oxygen and 12 sccm of a mixture of oxygen and helium at a power of 225 W under 4 mTorr. The poly 2 layer is etched so that about 70% of the exposed portions are removed. That is, about 70% of the poly 2 thickness is removed in the exposed portions of the substrate. This etching is also an anisotropic etch process.

Figure 3G:
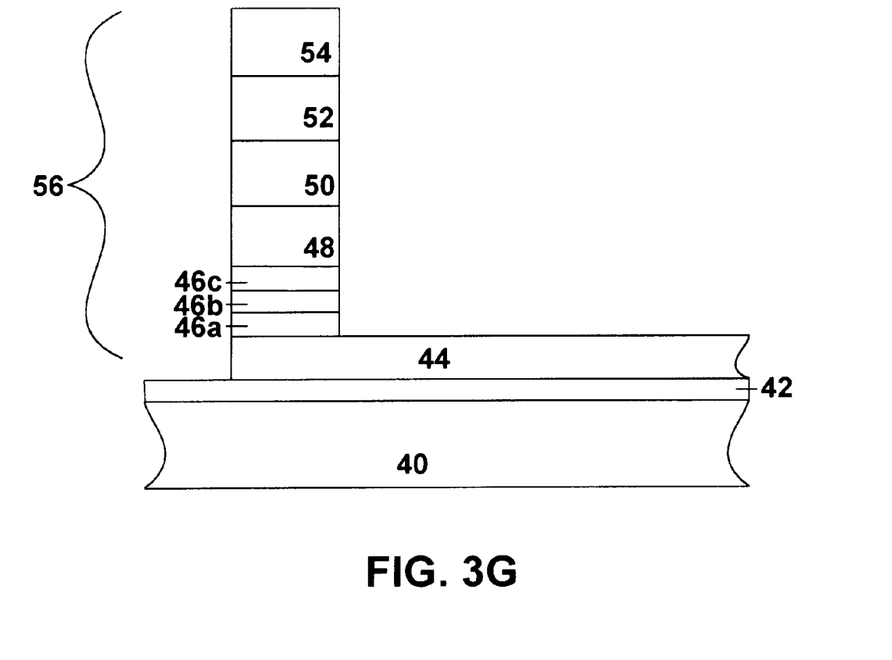

Referring to FIG. 3G, a self aligned etch is performed whereby selected portions of the poly 2 layer 48, interpoly dielectric layer 46 and poly 1 layer 44 are removed to form the select gate transistor. Although not shown, a mask is formed over portions of the structure where the select gate transistors and memory cells are positioned, exposing the selected portions of the poly 2 layer 48, interpoly dielectric layer 46 and poly 1 layer 44.

The poly 2 layer 48 and the interpoly dielectric layer 46 are etched in any suitable manner, such as using a gas flow containing 54 sccm of $CF_4$ and 10 sccm of oxygen at a power of 100 W under 25 mTorr. This etching is an anisotropic etch process. The poly 1 layer 44 is etched (but not in the poly 1 contact areas) in any suitable manner, such as using a gas flow containing 150 sccm of HBr, 10 sccm of chlorine, and 10 sccm of a mixture of oxygen and helium at a power of 250 W under 120 mTorr. This etching is an anisotropic etch process. This etching process is conducted thoroughly to prevent the formation of polystringers. Although not shown, source and drain regions can be formed after the self align etch. The formation of the source and drain regions by, for example, ion implantation is then conducted using suitable and known means. During the formation of the source and drain regions, the stacked gate structure 56 serves as a self-aligning mechanism. Ion implantation and annealing typically complete the formation of the source and drain regions. The self-align etch serves to form stacked structure 56 which as shown is a select gate transistor.

Figure 3H:
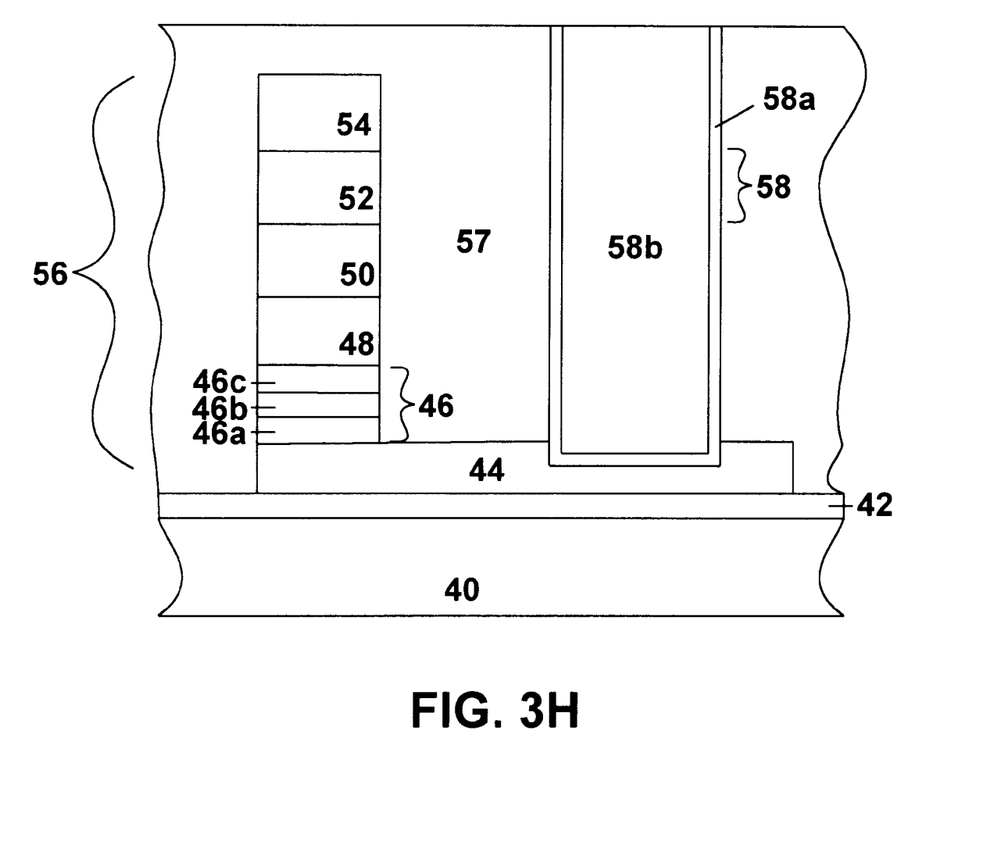

Referring to FIG. 3H, an interlevel oxide layer 57 is formed over the substrate, essentially encapsulating the memory cells (not shown) and the select gate transistors 56. The interlevel oxide layer 57 contains silicon dioxide. Contact holes are then formed through the interlevel oxide layer 57, to either the poly 1 layer or the poly 2 layer using a contact etch process. A mask (not shown) is positioned on the substrate so as to expose portions of the interlevel oxide layer 57 where the contact hole is formed. The contact hole is formed by anisotropic etching process. Typically, for example, the contact etch involves using a gas flow of $CH_3F$ and nitrogen.

Poly 1 contact 58 is made of a barrier layer 58a and contact plug 58b. In this embodiment, barrier layer 58a is made of two layers by depositing about 600 Å of a barrier metal such as titanium and 150 Å of titanium nitride by CVD. An RTA is optionally conducted. Next, a conductive metal such as tungsten is deposited and then polished to provide poly 1 contact 58. Additional steps to complete the fabrication of a flash memory device are known. The poly1 contact is characterized by low resistivity and no poly 1 punch-through, which in turn, leads to the production of reliable flash memory devices.

Although the invention has been shown and described with respect to a certain preferred embodiment or embodiments, it is obvious that equivalent alterations and modifications will occur to others skilled in the art upon the reading and understanding of this specification and the annexed drawings. In particular regard to the various functions performed by the above described components (assemblies, devices, circuits, etc.), the terms (including a reference to a "means") used to describe such components are intended to correspond, unless otherwise indicated, to any component which performs the specified function of the described component (i.e., that is functionally equivalent), even though not structurally equivalent to the disclosed structure which performs the function in the herein illustrated exemplary embodiments of the invention. In addition, while a particular feature of the invention may have been disclosed with respect to only one of several embodiments, such feature may be combined with one or more other features of the other embodiments as may be desired and advantageous for any given or particular application.

What is claimed is:

1. A method of forming a flash memory device, comprising:

forming a gate oxide layer on a substrate;

forming a first poly layer over the gate oxide layer;

forming an insulating layer over the first poly layer, the insulating layer comprising a first oxide layer over the first poly layer, a nitride layer over the first oxide layer, and a second oxide layer over the nitride layer;

forming a second poly layer over the insulating layer;

forming a tungsten silicide layer over the second poly layer;

etching a portion of the tungsten silicide layer and the second poly layer, wherein in the etched portion at least about 20% of the second poly is not etched, thereby partially defining at least one stacked gate structure;

etching at least a portion of the insulating layer and the unetched portion of the second poly layer thereby defining at least one select gate transistor structure;

forming an interlayer dielectric layer over the select gate transistor structure and substrate;

etching a contact hole through the interlayer dielectric layer to the first poly layer; and filling the contact hole with a conductive material to thereby form a flash memory device.

2. The method of claim 1, wherein etching a portion of the tungsten silicide layer and the second poly layer comprises etching the tungsten silicide layer using a gas flow containing from about 50 to about 300 sccm of at least one halogen compound and from about 0 to about 50 sccm of oxygen and an inert gas at a power from about 1,200 W to about 2,000 W under from about 0.1 to about 20 mTorr and etching the second poly layer using a gas flow containing from about 50 to about 200 sccm of a bromine compound and from about 0 to about 100 sccm of oxygen and an inert gas at a power from about 50 W to about 400 W under from about 0.1 to about 25 mTorr.

3. The method of claim 1, wherein etching at least a portion of the insulating layer and the unetched portion of the second poly layer comprises using a gas flow containing from about 10 to about 100 sccm of at least one fluorocarbon compound, from about 0 to about 50 sccm of oxygen and from about 0 to about 500 sccm of an inert gas at a power from about 25 W to about 300 W under from about 1 to about 200 mTorr.

4. The method of claim 1, wherein first poly layer has a thickness from about 500 Å to about 1,100 Å and the second poly layer has a thickness from about 1,000 Å to about 1,400 Å.

5. The method of claim 1, wherein each etching step is performed in an anisotropic manner.

6. The method of claim 1, wherein the interlayer dielectric layer comprises at least one of silicon dioxide, tetraethylorthosilicate, phosphosilicate glass, borophosphosilicate glass and borophosphotetraethylorthosilicate.

7. The method of claim 1, wherein the conductive material comprises at least one of aluminum, copper, gold, palladium, platinum, titanium, tungsten, and alloys, nitrides and silicides thereof.

8. A method of forming a select gate transistor poly 1 contact in a flash memory device comprising a substrate, a gate oxide layer over the substrate, a poly 1 layer over the gate oxide layer, an interpoly dielectric layer over the poly 1 layer, a poly 2 layer over the interpoly dielectric layer, and a tungsten silicide layer over the poly 2 layer, comprising:

etching anisotropically a portion of the tungsten silicide layer and the poly 2 layer, wherein in the etched portion from about 30% to about 80% of the poly 2 layer is removed, thereby partially defining a select gate transistor;

etching anisotropically at least a portion of the interpoly dielectric layer and the unetched poly 2 layer from the etched portion thereby defining the select gate transistor;

forming an interlayer dielectric layer over the select gate transistor;

etching anisotropically a contact hole through the interlayer dielectric layer to the poly 1 layer; and filling the contact hole with a conductive material thereby forming the select gate transistor poly 1 contact.

9. The method of claim 8, wherein etching anisotropically a portion of the tungsten silicide layer and the poly 2 layer comprises etching the tungsten silicide layer using a gas flow containing from about 100 to about 250 sccm of at least one halogen compound and from about 1 to about 40 sccm of oxygen and an inert gas at a power from about 1,400 W to about 1,800 W under from about 1 to about 10 mTorr and etching the poly 2 layer using a gas flow containing from about 75 to about 175 sccm of a bromine compound and from about 10 to about 90 sccm of oxygen and an inert gas at a power from about 100 W to about 300 W under from about 1 to about 20 mTorr.

10. The method of claim 8, wherein etching anisotropically at least a portion of the interpoly dielectric layer and the unetched portion of the poly 2 layer comprises using a gas flow containing from about 25 to about 75 sccm of at least one fluorocarbon compound, from about 1 to about 25 sccm of oxygen and from about 10 to about 250 sccm of an inert gas at a power from about 50 W to about 200 W under from about 5 to about 50 mTorr.

11. The method of claim 9, wherein the halogen compound comprises one or more of $Cl_2$, chlorocarbons, $SF_6$, fluorocarbons and HBr.

12. The method of claim 10, wherein the fluorocarbon compound comprises one or more of $CF_4$, $CHF_3$ and $CFH_3$.

13. The method of claim 8, wherein the select gate transistor poly 1 contact comprises a conductive metal and a barrier metal.

14. A method of preventing punch-through of a first doped amorphous silicon layer by a poly 1 contact in a NAND flash memory device comprising a substrate, a gate oxide layer over the substrate, the first doped amorphous silicon layer having a thickness from about 400 Å to about 1,200 Å over the gate oxide layer, an interpoly dielectric layer over the first doped amorphous silicon layer, a second doped amorphous silicon layer over the interpoly dielectric layer, and a tungsten silicide layer made using dichlorosilane over the second doped amorphous silicon layer, comprising:

etching anisotropically a portion of the tungsten silicide layer and the second doped amorphous silicon layer, wherein in the etched portion from about 35% to about 75% of the second doped amorphous silicon layer is removed, thereby partially defining a select gate transistor;

etching anisotropically at least a portion of the interpoly dielectric layer and the unetched second doped amorphous silicon layer from the etched portion thereby defining the select gate transistor;

forming an interlayer dielectric layer over the select gate transistor;

etching anisotropically a contact hole through the interlayer dielectric layer to the first doped amorphous silicon layer; and filling the contact hole with a conductive material comprising tungsten thereby forming the select gate transistor poly 1 contact.

15. The method of claim 14, wherein etching anisotropically a portion of the tungsten silicide layer and the second doped amorphous silicon layer comprises etching the tungsten silicide layer using a gas flow containing from about 150 to about 200 sccm of at least one halogen compound and from about 5 to about 30 sccm of oxygen and an inert gas at a power from about 1,200 W to about 2,000 W under from about 0.1 to about 20 mTorr and etching the second doped amorphous silicon layer using a gas flow containing from about 100 to about 150 sccm of a bromine compound and from about 25 to about 75 sccm of oxygen and an inert gas at a power from about 50 W to about 400 W under from about 0.1 to about 25 mTorr.

16. The method of claim 14, wherein etching anisotropically at least a portion of the interpoly dielectric layer and the unetched portion of the second doped amorphous silicon layer comprises using a gas flow containing from about 30 to about 60 sccm of at least one fluorocarbon compound, from about 5 to about 20 sccm of oxygen and from about 25 to about 200 sccm of an inert gas at a power from about 25 W to about 300 W under from about 1 to about 200 mTorr.

17. The method of claim 14, wherein the interpoly dielectric layer comprises two oxide layers sandwiching a nitride layer.

18. The method of claim 14, wherein the interlayer dielectric layer comprises silicon dioxide.

19. The method of claim 14, wherein etching anisotropically the contact hole through the interlayer dielectric layer comprises using a gas flow comprising $CH_3F$ and nitrogen.

20. The method of claim 14, wherein the tungsten silicide layer is made using a gas flow comprising $SiH_2Cl_2$ and $WF_6$.

* * * * *